US009134744B2

(12) United States Patent
Nork (10) Patent No.: US 9,134,744 B2
(45) Date of Patent: Sep. 15, 2015

(54) LOW CURRENT DC-DC CONVERTER WITH INTEGRATED LOW CURRENT COULOMB COUNTER

(71) Applicant: LINEAR TECHNOLOGY CORPORTION, Milpitas, CA (US)

(72) Inventor: Samuel H. Nork, Andover, MA (US)

(73) Assignee: LINEAR TECHNOLOGY CORPORATION, Milpitas, CA (US)

( * ) Notice: Subject to any disclaimer, the term of this patent is extended or adjusted under 35 U.S.C. 154(b) by 350 days.

(21) Appl. No.: 13/734,485

(22) Filed: Jan. 4, 2013

(65) Prior Publication Data

US 2014/0191741 A1    Jul. 10, 2014

(51) Int. Cl.
*H02M 3/156* (2006.01)
*G05F 1/62* (2006.01)
*G01R 29/24* (2006.01)
*H02J 7/00* (2006.01)
*H02M 1/00* (2007.01)
*H02M 3/158* (2006.01)

(52) U.S. Cl.
CPC *G05F 1/62* (2013.01); *G01R 29/24* (2013.01); *H02J 7/0078* (2013.01); *H02M 3/156* (2013.01); *H02M 3/1582* (2013.01); *H02M 2001/0032* (2013.01)

(58) Field of Classification Search
CPC . H02M 3/156; H02M 3/1588; Y02B 70/1466
USPC ............................. 323/222, 223, 232, 299, 301
See application file for complete search history.

(56) References Cited

U.S. PATENT DOCUMENTS

| 6,166,527 | A | * | 12/2000 | Dwelley et al. ............... 323/222 |
| 2004/0130387 | A1 | | 7/2004 | Marshall |
| 2010/0070220 | A1 | | 3/2010 | Darilek |
| 2010/0079127 | A1 | | 4/2010 | Grant |
| 2012/0253714 | A1 | * | 10/2012 | Vilhauer et al. ............... 702/63 |
| 2013/0132010 | A1 | * | 5/2013 | Winger et al. ................. 702/63 |
| 2014/0097814 | A1 | * | 4/2014 | Brewster ...................... 323/282 |

OTHER PUBLICATIONS

Extended European Search Report issued in European Application No. 14000003.5-1806 dated May 30, 2014.

* cited by examiner

*Primary Examiner* — Adolf Berhane
*Assistant Examiner* — Yemane Mehari
(74) *Attorney, Agent, or Firm* — McDermott Will & Emery LLP (57) ABSTRACT

A power supply system includes a regulator circuit responsive to an input signal at the input node for producing an output signal at the output node at a desired level. The regulator circuit has a controller, an inductive element and a first switch coupled to the inductor element and controlled by the controller to produce the output signal. Also, the power supply system includes a Coulomb counter for producing a Coulomb count signal proportional to the number of Coulombs passing from the input node to the output node. The Coulomb counter is enabled by an enabling signal representing a predetermined time period, for determining the number of Coulombs passing from the input node to the output node during that predetermined time period.

18 Claims, 5 Drawing Sheets

LOW CURRENT DC-DC CONVERTER WITH INTEGRATED LOW CURRENT COULOMB COUNTER

TECHNICAL FIELD

This disclosure relates to power supply systems, and more particularly, to a low current DC-DC converter with an integrated low current Coulomb counter.

BACKGROUND ART

Many battery powered applications perform best at a supply voltage that differs from the battery voltage. DC-DC converters are designed to solve this problem, and many different types of converters exist for this purpose. Battery powered applications often require low quiescent current DC-DC conversion to extend battery life or optimize performance.

It is also beneficial in many battery power applications to know how many Coulombs have been consumed since the battery was installed or fully charged. This information is often the only reliable means for estimating the remaining battery life—especially in cases where the battery discharge curve is very flat (e.g., Li-SOCL2 batteries, etc.) and the battery voltage provides no useful basis for estimating state of charge.

Conventional Coulomb counters continuously monitor current flowing into or out of a battery and keep a running tally of Coulombs that have passed through the external sense resistor. In the case of a discharging battery, Coulombs consumed are calculated by multiplying the average current by the total time.

However, continuous monitoring of the battery current requires relatively high operating current which in turn discharges the battery. In a conventional Coulomb counter, the quiescent current may be between 70 μA and 100 μA which is unacceptably high for many long lifetime primary cell battery applications. Without continuous monitoring, a conventional Coulomb counter may miss significant discharge events. Also, the Coulomb counter accuracy could suffer greatly.

Therefore, there is a need for a new technique that would combine low quiescent current DC-DC conversion with low current and accurate Coulomb counting.

SUMMARY OF THE DISCLOSURE

In accordance with one aspect, the present disclosure offers a novel power supply system having an input node and an output node. The power supply system includes a regulator circuit responsive to an input signal at the input node for producing an output signal at the output node at a desired level. The regulators circuit has a controller, an inductive element and a first switch coupled to the inductor element and controlled by the controller to produce the output signal. Also, the power supply system includes a Coulomb counter for producing a Coulomb count signal proportional to the number of Coulombs passing from the input node to the output node. The Coulomb counter is enabled by an enabling signal representing a predetermined time period, for determining the number of Coulombs passing from the input node to the output node during that predetermined time period.

When the regulator circuit is configured to operate in a buck-boost mode or in a buck mode, the enabling signal may represent a time period during which the first switch is ON.

Alternatively, when the regulator circuit is configured to operate in a boost mode and includes a second switch coupled to the inductive element, the enabling signal may represent the sum of a first time period during which the first switch is ON and a second time period during which the second switch is ON.

The Coulomb counter may be configured for counting the number of Coulombs transferred to the output node from a battery coupled to the input node.

Alternatively, the Coulomb counter may be configured for counting the number of Coulombs transferred from the input node to a battery coupled to the output node.

In accordance with one aspect of the present disclosure, the Coulomb counter may be enabled for determining the number of Coulombs during only one ON time period of the first switch out of a predetermined number of successive ON time periods.

In accordance with another aspect of the disclosure, the regulator circuit may be configured for operating in a sleep mode when the output voltage is above a predetermined regulation point. Circuitry for determining the number of Coulombs are not active when the regulator circuit is in a sleep mode.

In accordance with an exemplary embodiment of the present disclosure, the Coulomb counter may include a Coulomb measuring circuit for determining the number of Coulombs passing from the input node to the output node during the predetermined time period to produce a value representing the determined number of Coulombs.

A result accumulating circuit may be coupled to the output of the Coulomb measuring circuit for accumulating values produced by the Coulomb measuring circuit. An accumulated value in the result accumulating circuit may represent the total number of periods during which the first switch is ON.

The regulator circuit and the Coulomb counter may be integrated on a single integrated circuit.

In accordance with a method of the present disclosure, the following steps are carried out when power is supplied from an input node to an output node:

in response to an input signal at the input node, producing an output signal at an output node at a desired level, determining the number of Coulombs passing from the input node to the output node during a predetermined time period to produce a measurement value representing the number of Coulombs per the predetermined time period, and accumulating measurement values determined during a number of predetermined time periods to produce a Coulomb count signal representing the total number of Coulombs transferred from the input node to the output node.

Additional advantages and aspects of the disclosure will become readily apparent to those skilled in the art from the following detailed description, wherein embodiments of the present disclosure are shown and described, simply by way of illustration of the best mode contemplated for practicing the present disclosure. What is disclosed may be implemented with other and different embodiments, and is susceptible of modification in various obvious respects. Accordingly, the drawings and description are to be regarded as illustrative in nature, and not as limiting.

BRIEF DESCRIPTION OF THE DRAWINGS

The following detailed description of the embodiments of the present disclosure can best be understood when read in conjunction with the following drawings, in which the features are not necessarily drawn to scale but rather are drawn as FIG. 1 illustrates a simplified diagram of an exemplary buck-boost DC-DC converter in accordance with the present disclosure.

DETAILED DISCLOSURE OF THE EMBODIMENTS

The present disclosure will be made using specific examples presented below. It will become apparent, however, that the concept of the disclosure is applicable to any power converter with a Coulomb counter.

Figure 1:
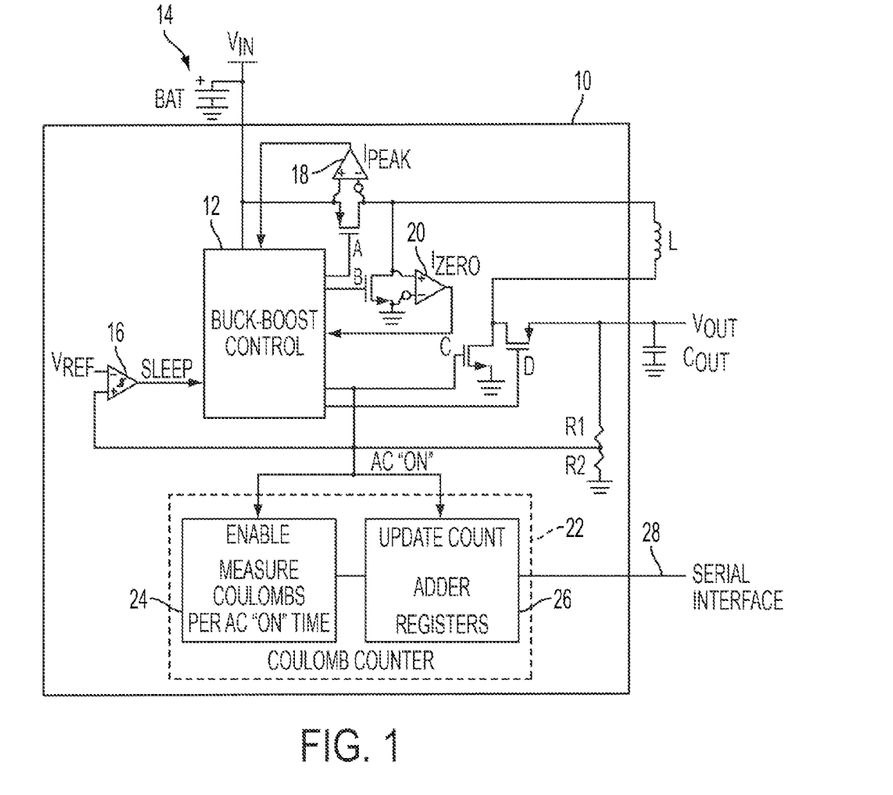

FIG. 1 shows an exemplary buck-boost DC-DC converter 10 of the present disclosure having an input node VIN and an output node VOUT. The converter 10 may include an inductor L, switches A, B, C and D coupled to an inductor L, an output capacitor COUT coupled to the output node VOUT and a controller 12 that controls the switches A, B, C and D. The converter 10 is responsive to an input voltage VIN at its input node to produce a regulated output voltage VOUT at its output node that can be higher or lower than VIN, or equal to VIN. For example, the DC-DC converter 10 may regulate the voltage supplied from a battery 14 coupled to the input node VIN. A load, such as an electronic device powered by the battery 14 may be connected to the output node VOUT of the DC-DC converter 10.

The output voltage regulation is achieved using hysteretic control that can be implemented based on a very low current hysteretic comparator 16 that controls enabling of the DC-DC converter 10. The hysteretic comparator 16 senses the output voltage VOUT, and compares VOUT with a regulation point defined by a reference voltage VREF. For example, a non-inverting input of the comparator 16 may be supplied from a node between resistors R1, R2 of a voltage divider coupled to the output node VOUT. An inverting input of the comparator 16 may be supplied with the VREF voltage.

If the voltage VOUT is above the regulation point, the DC-DC converter 10 is disabled and operates in a SLEEP mode during which all circuits not essential to measuring the output voltage VOUT are shutdown thereby minimizing the quiescent current of the DC-DC converter 10. When VOUT is below the regulation point, the comparator 16 enables the DC-DC converter 10, and a programmed, fixed amount of charge is transferred from the node VIN to the node VOUT repeatedly until the output voltage VOUT is above the regulation point.

When the DC-DC converter 10 is enabled, the controller 12 turns the switches A and C ON at the same time providing a path for current to flow from the VIN node through the inductor L and into a ground terminal. Current will ramp up linearly through the inductor L until a pre-set programmed peak current value IPEAK is reached as sensed by an IPEAK comparator 18 monitoring the voltage across the switch A.

Once the IPEAK value is reached, the switches A and C turn OFF and the switches B and D turn ON. Current will now continue to flow through the inductor L and transfer charge into the output VOUT. The inductor current is allowed to ramp down to zero as sensed by the IZERO comparator 20 monitoring the voltage across the switch B. Once the inductor current reaches the zero point, the switches B and D are turned OFF. If at this point the output VOUT is not yet above the regulation point, the switches A and C are turned ON again and the entire switching cycle described above repeats.

Hence, each switching cycle of the DC-DC comparator 10 includes an AC "ON" phase when the switches A and C are ON, and switches B and D are OFF, and a BD "ON" phase when the switches B and D are ON, and the switches A and C are OFF. Both the ramp up and ramp down current rates are determined by the application conditions and the equation $V/L=di/dt$ where L is the inductive value of the inductor L, $di/dt$ is a current rate, V=VIN during the AC "ON" phase and V=VOUT during the BD "ON" phase. Once VOUT has risen above the regulation point after completion of a switching cycle, the converter is disabled and the DC-DC converter 10 goes back into a low quiescent current SLEEP mode.

Further, the DC-DC converter 10 includes a Coulomb counter 22 that may be integrated with the voltage regulator circuitry on a single integrated circuit. The Coulomb counter 22 may include a Coulomb measuring circuit 24 and a result accumulating circuit 26. The Coulomb measuring circuit 24 is enabled only when the switches A and C are turned ON, and is disabled when the switches A and C are OFF.

Hence, to achieve low quiescent current, the Coulomb measuring circuit 24 determines the number of Coulombs passing from the VIN node to the VOUT node only during the AC "ON" phase of the DC-DC converter 10. The total number of Coulombs transferred from the VIN node to the VOUT node is calculated by the result accumulating circuit 26 that accumulates results of the Coulomb measurements performed by the circuit 24. The result accumulating circuit 26 may include registers for storing results of the Coulomb measurements per an AC "ON" phase and an adder for adding the most recent Coulomb measurement result to the previous measurements results. The accumulated value representing the total number of the Coulombs transferred from the VIN node to the VOUT node may be read from the result accumulating circuit 26 by an application processor via a serial interface 28.

Figure 2:
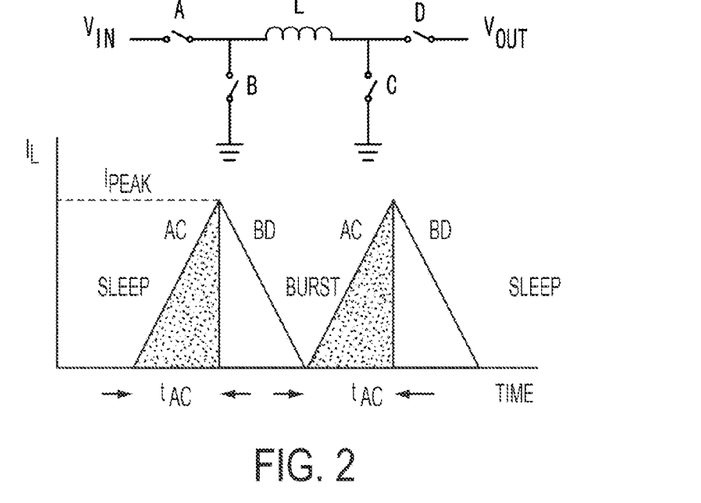
FIG. 2 are diagrams illustrating operation of the converter in FIG. 1.

As illustrated in FIG. 2, the number of Coulombs transferred per the AC "ON" phase equals the average current of the DC-DC converter 10 multiplied by "ON" time $t_{AC}$ of the switch A or switch C, i.e. by the time period during which the switches A and C are ON. The average current is equal to IPEAK/2. Hence, the number of Coulombs transferred per the AC "ON" phase equals $(IPEAK/2) \times [IPEAK \times (L/VIN)]$ assuming that VIN and L remain constant during the AC "ON" phase.

FIG. 2 shows a simplified circuit of the converter 10 including switches A, B, C and D coupled to the inductor L, and a timing diagram illustrating variations of the inductor current $I_L$ during the AC "ON" and BD "ON" phases. The diagram shows an example in which two switching cycles of the converter 10 are performed after the converter 10 is activated from the SLEEP mode until the converter 10 is placed back into the SLEEP mode.

Since the input voltage VIN and inductor L values change very slowly for a given application over the lifetime of the battery, the quiescent current may be further reduced by enabling the Coulomb measuring circuit 24 at a predetermined low sample rate. For example, the Coulomb measuring circuit 24 may be enabled only during one AC "ON" phase for every 1024 AC "ON" phases of the converter 10. Hence, the Coulomb measurement will be performed during one AC "ON" phase for every 1024 AC "ON" phases. When the circuit 24 does not perform Coulomb measuring, all circuits of the Coulomb measuring circuit 24 may be disabled. Hence, the effective quiescent current of the Coulomb measuring circuit 24 may be reduced by 1024 times compared to the quiescent current of the Coulomb measurement circuitry that measures the Coulombs in every AC "ON" phase. The sample rate for measuring Coulombs per AC "ON" time may be reduced as needed to minimize the Coulomb counting error due to the quiescent current in the AC "ON" phases when the Coulombs are not measured. The tradeoff is that fewer sample measurements of Coulombs per AC "ON" phase will be used over the operating life of the battery. To further reduce the quiescent current, the Coulomb counter 22 may be also disabled when the DC-DC converter 10 is in the SLEEP mode.

Figure 3:
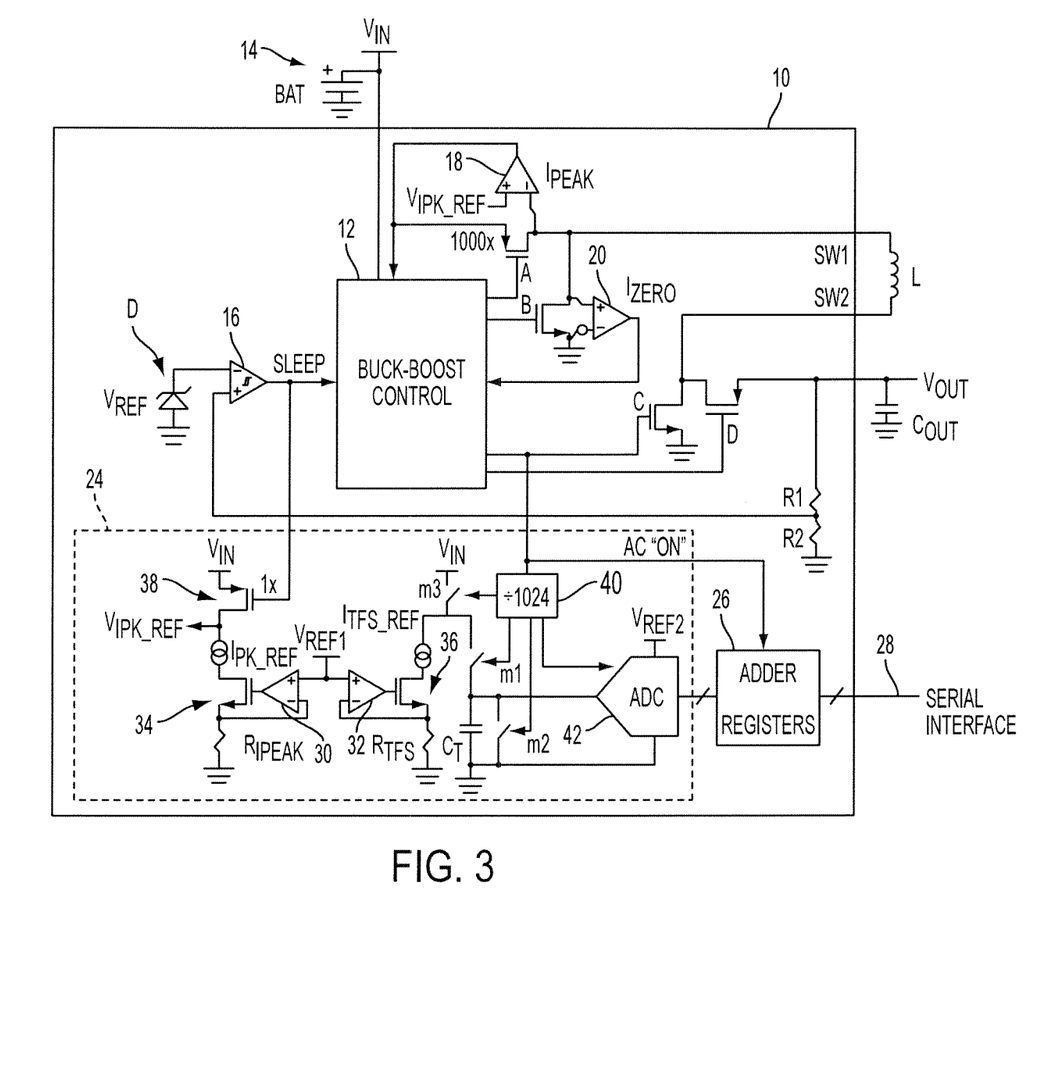
FIG. 3 illustrates an exemplary buck-boost DC-DC converter with Coulomb counter in more detail.

FIG. 3 shows an exemplary embodiment of the buck-boost DC-DC converter 10 with a Coulomb counter in more detail. As discussed above in connection with FIG. 1, the DC-DC converter 10 is responsive to an input voltage VIN at its input node to produce a regulated output voltage VOUT at its output node that can be higher or lower than VIN, or equal to VIN. The DC-DC converter 10 includes a controller 12, an inductor L, an output capacitor COUT coupled to the output node VOUT and switches A, B, C and D coupled to an inductor L. For example, the switches A and D may be P-type MOSFET devices, and switches B and C may be N-type MOSFET devices.

In an example in FIG. 3, the VIN node of the converter 10 is coupled to a battery 14 to regulate the voltage supplied from the battery 14. As discussed in connection with FIG. 1, the DC-DC converter 10 includes a very low current hysteretic comparator 16 that controls enabling of the DC-DC converter 10 by sensing the output voltage VOUT, and comparing it with a regulation point defined by a reference voltage VREF. A bandgap voltage reference represented by a Zener diode D may be used for providing the reference voltage VREF to the hysteresis comparator.

Also, the converter 10 includes an IPEAK comparator 18 that monitors the voltage across the switch A to compare the inductor current with a pre-programmed peak current value IPEAK. The converter 10 further includes an IZERO comparator 20 that monitors the voltage across the switch B to compare the inductor current with a zero level.

If VOUT is above the regulation point, the DC-DC converter 10 is disabled by the comparator 16 and operates in a SLEEP mode during which all circuits not essential to measuring the output voltage VOUT are shutdown thereby minimizing the quiescent current of the DC-DC converter 10. When VOUT is below the regulation point, the comparator 16 enables the DC-DC converter 10, and a programmed, fixed amount of charge is transferred from the node VIN to the node VOUT repeatedly until the output voltage VOUT is above the regulation point. The switches A, B. C and D are controlled by the controller 12 in a manner described above in connection with FIG. 1. The entire switching cycle of the converter 10 includes an AC "ON" phase when the switches A and C are ON, and switches B and D are OFF, and a BD "ON" phase when the switches B and D are ON, and the switches A and C are OFF.

As shown in FIG. 3, an exemplary Coulomb measuring circuit 24 that measures the number of Coulombs transferred during an AC "ON" phase, may include operational amplifiers 30 and 32, MOSFET transistors 34 and 36 respectively coupled to the outputs of the amplifiers 30 and 32, current sources IPK_REF and ITFS_REF respectively connected to the drain terminals of the MOSFET transistors 34 and 36, and resistors $R_{IPEAK}$ and $R_{TFS}$ respectively coupled to the source terminals of the MOSFET transistors 34 and 36. A MOSFET transistor 38 may be coupled between the output of the comparator 16 and the current source IPK_REF. For example, the transistors 34 and 36 may be N-type MOSFET devices, and the transistor 38 may be an P-type MOSFET device.

Also, the Coulomb measuring circuit 24 may include a timing capacitor $C_T$, switches m1 and m2 coupled to the capacitor $C_T$, and a switch m3 controllable to provide the input voltage VIN for charging the capacitor $C_T$. A divider 40 may control the switches m1, m2 and m3. The divider 40 may receive an AC "ON" signal produced when the switch C is turned ON and may perform division by a predetermined number, e.g. 1024, so as to close the switch m3 based on a desired sampling rate, for example, only in one AC "ON" phase out of successive 1024 AC "ON" phases. The switch m3 is closed to supply the input voltage VIN to the Coulomb measuring circuit 24 so as to enable counting the number of Coulombs only during the AC "ON" phases selected based on the sampling rate, for example, during only one AC "ON" phase out of every 1024 AC "ON" phases.

An analog-to-digital converter (ADC) 42 may be coupled at the output of the Coulomb measuring circuit 24 to convert an analog measurement result into a digital value supplied to the result accumulating circuit 26. The ADC 42 may be supplied with a reference voltage VREF2 selected to support analog-to-digital conversion in a desired range.

The operational amplifier 30 and transistors 34 and 38 are connected to set a predetermined reference voltage VREF1 across resistor $R_{IPEAK}$ so as to set the reference current IPK_REF at a fixed ratio relative to the peak current IPEAK monitored at the switch A. For example, the reference current IPK_REF may be set equal to 1/1000 of the peak current IPEAK current. A reference voltage VIPK_REF produced at the drain of the transistor 38 may be supplied to the IPEAK comparator 18.

The operational amplifier 32 and transistor 36 are connected to set the reference voltage VREF1 across resistor $R_{TFS}$ so as to produce a reference current ITFS_REF at a fixed ratio relative to the IPEAK current. The reference current ITFS_REF is used to charge the capacitor $C_T$ for the duration of the AC "ON" phase.

Prior to turning the switches A and C ON, the capacitor $C_T$ is fully discharged by closing switch m2. At the beginning of the AC "ON" phase, the switch m2 is opened and the switch m1 is closed allowing the ITFS_REF current to charge the capacitor $C_T$. At the end of the AC "ON" phase, the switch m1 is opened which prevents the voltage on the capacitor $C_T$ from changing. Since a fixed current flowing into the capacitor $C_T$ results in a voltage that is directly proportional to time, the voltage present on the capacitor $C_T$ after the switch m1 is opened is directly proportional to the duration of the AC "ON" phase, during which current was flowing into the $C_T$ capacitor. Since the number of Coulombs equals the average current multiplied by time, the voltage present on the capacitor $C_T$ is also directly proportional to the number of Coulombs transferred per the AC "ON" phase.

The voltage on the capacitor $C_T$ is measured by the ADC 42 that produces an output code providing a digital representation of the number of Coulombs transferred per the AC "ON" cycle. The ITFS_REF current and capacitor $C_T$ values may be programmed on the chip of the converter 10 such that the full scale measurement range of the ADC 42 corresponds to a pre-determined full scale time $t_{FS}$. The product IPEAK/2*$t_{FS}$ is a pre-set programmed value and equals the maximum number of Coulombs passing from VIN to VOUT that may be measured per an AC "ON" phase. The actual output code of the ADC represents the actual number of Coulombs per the AC "ON" phase selected based on the sampling rate.

Since the actual number of Coulombs transferred per AC "ON" cycle is measured on the chip of the converter 10, the method for counting the total number of Coulombs is simplified. Each time when the switches A and C are turned "ON" during the AC "ON" phase, the AC "ON" signal that can be supplied from the gate of the switch C enables the result accumulating circuit 26 to add the most recent output value of the ADC 42 to the accumulated number of Coulombs that have already been counted. This addition process repeats each and every time switches A and C are turned "ON", and the value that gets added to the total number is updated each time a new Coulomb number measurement is performed by the Coulomb measuring circuit 24. The result accumulating circuit 26 may include an adder for adding the value at the output of the ADC 42 to the accumulated value, and digital registers for storing the accumulated number. The adder and registers may be provided on the chip of the controller 10.

The accumulated value in the result accumulating circuit 26 represents the total number of Coulombs that have passed from the VIN node to the VOUT node. In a battery application, this value represents the total number of Coulombs that have been discharged from the battery 14 and delivered to the load coupled to the VOUT node, and thus provides an indication of total battery capacity consumed. The digital registers that store the accumulated value for Coulombs transferred from the VIN node to the VOUT node may remain static between the AC "ON" phases. Therefore, the accumulated data may be read back by an application processor via the serial interface 28, as needed. Since no other circuits of the Coulomb counter 22 are active while the DC-DC converter is in the SLEEP mode, the overall quiescent current for the entire Coulomb counter 22 is approximately zero.

Hence, the DC-DC converter 10 of the present disclosure provides ultra-low quiescent current DC-DC conversion from the input voltage VIN to a desired output voltage VOUT as well as accurate counting of Coulombs transferred from the VIN node to the VOUT node. The DC-DC conversion and the Coulomb counting can be achieved simultaneously using a single integrated circuit. Furthermore, the Coulomb counter quiescent current is reduced essentially to zero.

Figure 4:
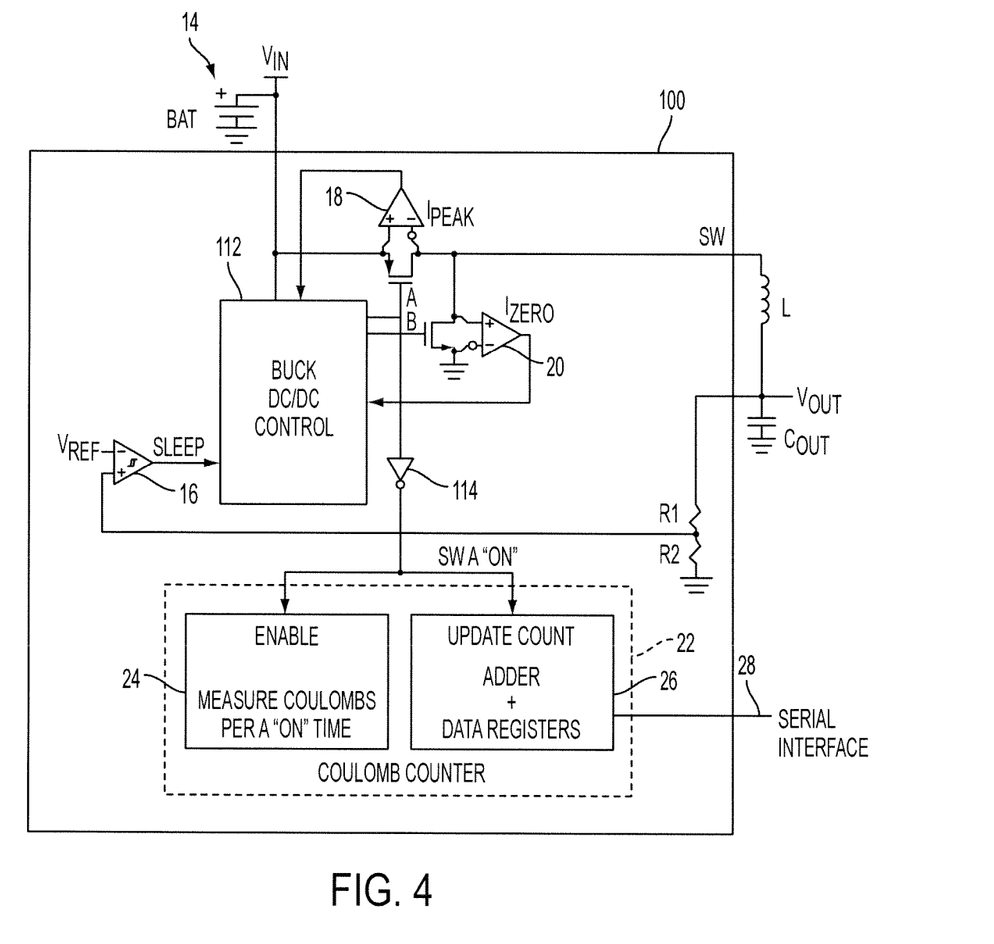
FIG. 4 illustrates an exemplary buck DC-DC converter of the present disclosure.

FIG. 4 illustrates an exemplary buck converter 100 with an integrated Coulomb counter 22 of the present disclosure. The buck converter 100 includes a buck controller 112 that controls switches A and B to produce a regulated output voltage VOUT which is lower than the input voltage VIN. During the buck DC-DC conversion, switch A is turned ON allowing current to flow from the VIN node to the VOUT node through the inductor L. Once a peak current value is reached as monitored by the IPEAK comparator 18, the switch A turns OFF and the switch B turns ON allowing current to continue flowing through the inductor into the VOUT node until the current ramps down to zero as detected by the IZERO comparator 20. The Coulombs that pass from the VIN node to the VOUT node are counted each time the switch A is ON. The control electrode of the switch A is coupled to the enable input of the Coulomb measuring circuit 24 and the update count input of the result accumulating circuit 26 via an inverting circuit 114. The counting method is exactly the same as in the buck-boost case discussed in connection with FIG. 1 as long as the current through the switch A begins its ramp at zero and ramps to a known, programmed peak value.

Figure 5:
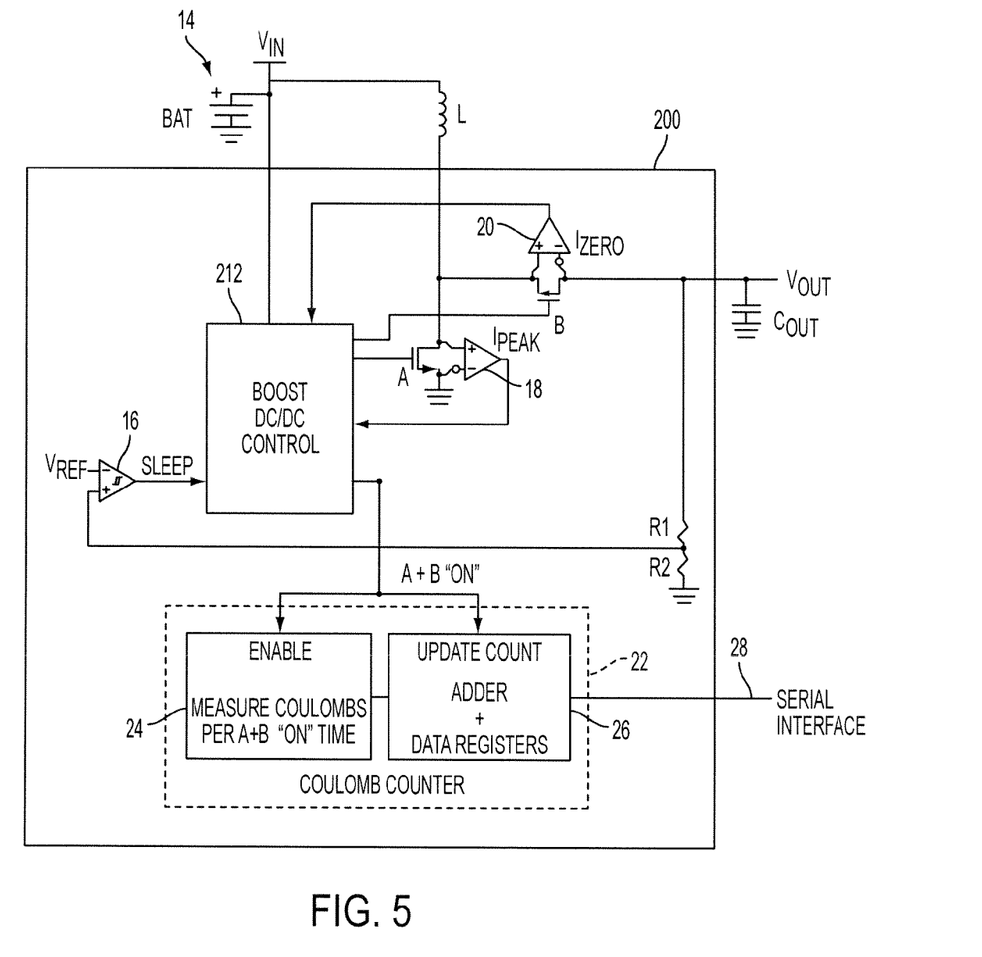
FIG. 5 illustrates an exemplary boost DC-DC converter of the present disclosure.

FIG. 5 shows an exemplary boost DC-DC converter 200 with an integrated Coulomb counter 22 of the present disclosure. The boost converter 200 includes a boost controller 212 that controls switches A and B to produce a regulated output voltage VOUT which is higher than the input voltage VIN. In the case of a boost converter 200, current flows from the VIN node through the inductor L to ground when the switch A is ON. The current will ramp from zero until a peak value IPEAK is reached at a rate determined by the voltage VIN and the inductance of the inductor L. The average current through the switch A is equal to IPEAK/2 similar to the buck-boost case discussed in connection with FIG. 1. Once the IPEAK level is reached as determined by the IPEAK comparator 18, the switch A is turned OFF and the switch B is turned ON which allows the current to continue to flow from the VIN through the inductor L and through the switch B into the VOUT node. The current in the switch B will decay linearly from the IPEAK level to zero as detected by the IZERO comparator 20. At this point, the switch B will turn OFF. This cycle will repeat until the output is in regulation. The average value of current flowing through switch B when switch B is ON is IPEAK/2. The Coulomb counter 22 counts the Coulombs transferred when both the switch A and the switch B are ON in a manner discussed above in connection with FIG. 1.

Figure 6:
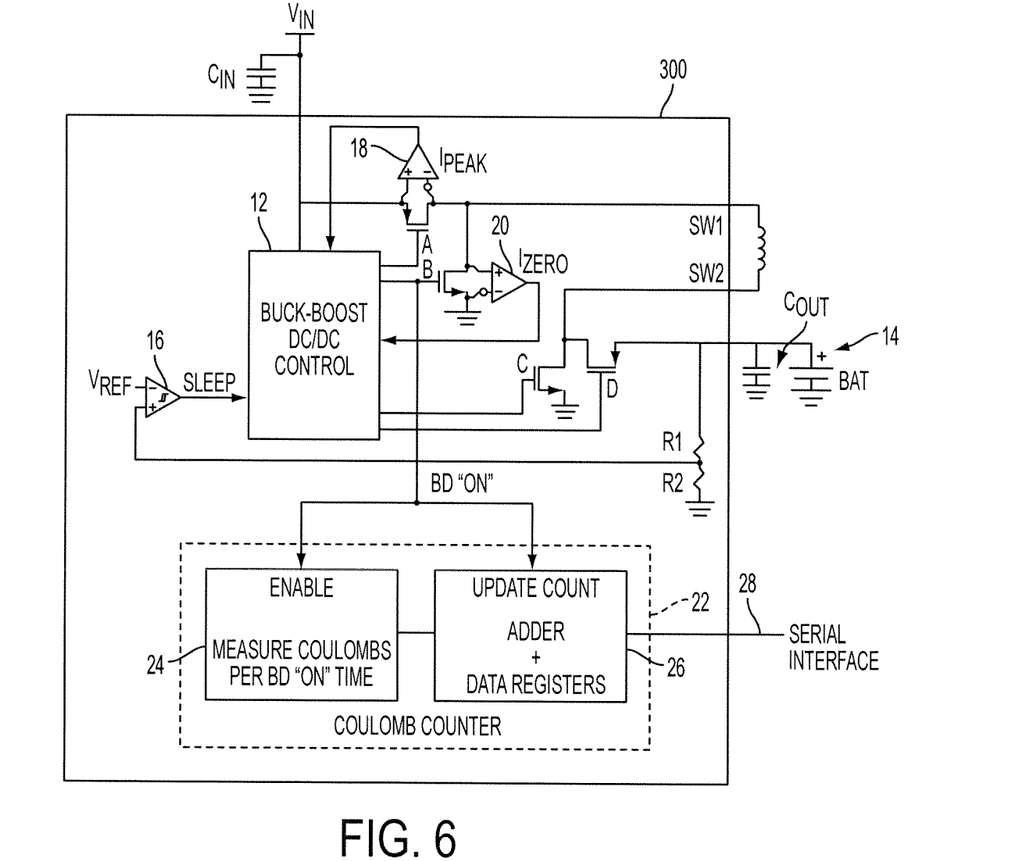
FIG. 6 illustrates an exemplary DC-DC converter for charging a battery in accordance with the present disclosure.

FIG. 6 shows that a DC-DC converter of the present disclosure may be used to count the Coulombs going into a battery 14 that is being charged using the DC-DC converter. A DC-DC converter 300 in FIG. 6 may have the same arrangement as the DC-DC converter 10 in FIG. 1, however the battery 14 is coupled to the VOUT node of the converter, instead of the VIN node. An input capacitor $C_{IN}$ is connected to the VIN node. The integrated Coulomb counter 22 counts the total number of Coulombs that are transferred into the battery 14. When the converter 300 is enabled, the current through the inductor L ramps from zero to IPEAK when the switches A and C are ON, and the current flowing to the battery 14 ramps from IPEAK to zero when the switches B and D are ON. Hence, the average current flowing into the battery 14 when switches B and D are ON is IPEAK/2. The Coulomb counter 22 counts the Coulombs going to the battery 14 each time switches B and D are ON. Hence, the Coulomb counter 22 is enabled during the BD "ON" phase instead of the AC "ON" phase as in the case discussed in connection with FIG. 1.

Coulomb counting in conjunction with other switching converter topologies such as flyback, etc, may be realized using the same approach by forcing current to ramp from zero to a known peak value on each charge transfer cycle and then back down to zero before the next cycle begins. If these conditions are met, then the appropriate "ON" time may be measured on-chip and a corresponding number of Coulombs per cycle may be calculated and added to the accumulated sum of Coulombs transferred.

The foregoing description illustrates and describes aspects of the present invention. Additionally, the disclosure shows and describes only preferred embodiments, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art.

The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein.

What is claimed is:

1. A power supply system having an input node and an output node, comprising:
   a regulator circuit responsive to an input signal at the input node for producing an output signal at the output node at a desired level, and having a controller, an inductive element and a first switch coupled to the inductor element and controlled by the controller to produce the output signal, and
   a Coulomb counter for producing a Coulomb count signal proportional to the number of Coulombs passing from the input node to the output node, the Coulomb counter being enabled by an enabling signal representing a predetermined time period, for determining the number of Coulombs passing from the input node to the output node during the predetermined time period.

2. The system of claim 1, wherein the enabling signal represents a time period during which the first switch is ON.

3. The system of claim 2, wherein the regulator circuit is configured to operate in a buck-boost mode.

4. The system of claim 2, wherein the regulator circuit is configured to operate in a buck mode.

5. The system of claim 1, wherein the regulator circuit is configured to operate in a boost mode and includes a second switch coupled to the inductor element.

6. The system of claim 5, wherein the enabling signal represents the sum of a first time period during which the first switch is ON and a second time period during which the second switch is ON.

7. The system of claim 1, wherein the Coulomb counter is configured for counting the number of Coulombs transferred to the output node from a battery coupled to the input node.

8. The system of claim 1, wherein the Coulomb counter is configured for counting the number of Coulombs transferred from the input node to a battery coupled to the output node.

9. The system of claim 2, wherein the Coulomb counter is enabled for determining the number of Coulombs during only one ON time period of the first switch out of a predetermined number of successive ON time periods of the first switch.

10. The system of claim 1, wherein the regulator circuit is configured for operating in a sleep mode when the output voltage is above a predetermined regulation point.

11. The system of claim 10, wherein circuitry for determining the number of Coulombs is disabled when the regulator circuit is in a sleep mode.

12. The system of claim 1, wherein the Coulomb counter includes a Coulomb measuring circuit for determining the number of Coulombs passing from the input node to the output node during the predetermined time period to produce a value representing the determined number of Coulombs, and a result accumulating circuit for accumulating values produced by the Coulomb measuring circuit.

13. The system of claim 12, wherein an accumulated value in the result accumulating circuit represents total number of periods during which the first switch is ON.

14. The system of claim 1, wherein the regulator circuit and the Coulomb counter are integrated on a single integrated circuit.

15. A method of supplying power from an input node to an output node, comprising the steps of:
   in response to an input signal at the input node, producing an output signal at an output node at a desired level,
   determining the number of Coulombs passing from the input node to the output node only during a predetermined time period to produce a measurement value representing the number of Coulombs per the predetermined time period, and
   accumulating measurement values determined during a number of predetermined time periods to produce a Coulomb count signal representing the total number of Coulombs transferred from the input node to the output node.

16. The method of claim 15, wherein the output signal is produced by a regulator circuit having a first controllable switch, and the predetermined period represents an ON time period of the first controllable switch.

17. The method of claim 16, wherein the number of Coulombs is determined during only one ON time period of the first controllable switch out of a predetermined number of successive ON time periods of the first controllable switch.

18. The method of claim 15, wherein the output signal is produced by a regulator circuit having first and second controllable switches, and the predetermined period represents the sum of an ON time period of the first controllable switch and an ON time period of the second controllable switch.

* * * * *